United States Patent [19]

Tasch, Jr.

[11] 4,145,803
[45] Mar. 27, 1979

[54] LITHOGRAPHIC OFFSET ALIGNMENT TECHNIQUES FOR RAM FABRICATION

[75] Inventor: Aloysious F. Tasch, Jr., Richardson, Tex.

[73] Assignee: Texas Instruments Incorporated, Dallas, Tex.

[21] Appl. No.: 817,949

[22] Filed: Jul. 22, 1977

[51] Int. Cl.$^2$ .............................................. B01J 17/00
[52] U.S. Cl. ........................................ 29/571; 29/578; 29/589; 357/24; 357/91
[58] Field of Search ................. 29/571, 578, 589, 590, 29/591; 357/24, 91

[56] References Cited

U.S. PATENT DOCUMENTS 3,913,211  10/1975  Seeds ....................................... 29/571

*Primary Examiner*—W. Tupman
*Attorney, Agent, or Firm*—Melvin Sharp; Richard L. Donaldson; William E. Hiller

[57] ABSTRACT

Lithographic offset alignment techniques for MOS dynamic RAM memory cell fabrication to enable increased packing density while maintaining the minimum patterned geometry. Technique of cell fabrication involves initial oxidation of P-type silicon, for example, followed by silicon nitride deposition. Thereafter, moats are etched using the composite silicon dioxide-silicon nitride layers, followed by boron deposition or ion implantation in regions of the silicon substrate exposed by the etching treatment. The moats are then filled by oxidation to form a large field deposit of silicon dioxide extending above the level of the oxide layer in the regions where the moats were formed. The remaining composite silicon dioxide-silicon nitride layers are then removed, followed by gate oxidation. A P-type ion implant is provided beneath the thin oxide region between the regions to be overlaid by a polysilicon electrode and the thick field oxide of the succeeding cell. Thereafter, polysilicon is deposited and patterned, the patterned polysilicon electrode covering a fraction of the P-type implant. The gate oxide is then removed by etching, followed by N+ diffusion or ion implantation in the exposed region of the P-type implant to define a bit line having a length less than the minimum patterned geometry. Oxide is then applied by chemical vapor deposition, followed by a deposit of metal or polysilicon and patterning as required. The offset alignment of the polysilicon electrode with respect to the P-type implant creates the smaller dimension for the sense line. A fabrication technique for the CC RAM having an implanted storage region and a fabrication technique for a double-level polysilicon cell both using offset alignment techniques are also disclosed.

23 Claims, 12 Drawing Figures

LITHOGRAPHIC OFFSET ALLIGNMENT TECHNIQUES FOR RAM FABRICATION

BACKGROUND OF THE INVENTION

This invention relates to the method of fabricating semiconductor memories, and more particularly to fabrication techniques for the charge coupled RAM cell and the double level poly-RAM cell.

During the past several years, much time and effort has gone into the development of high density, low cost memories. This is due to the computer industry's continual demand for more storage capacity at a reduced cost. As a result of past memory development work, the number of bits of storage per chip has increased from 16 to 64,000. In addition, the cost per bit has been decreased by a factor of at least 200.

A major reason for this progress has been the development of small, reliable memory cells. Thousands of these cells are formed on a single chip and the chips are interconnected to form large memories. The cost in the production of semiconductor chips is such that most of the expense is in bonding, packaging, testing, handling and the like, rather than in the cost of the small chip of silicon which contains the actual circuitry. Thus, any circuit which can be contained within a chip of a given size, for example, 30,000 square mils, will cost about the same as any other. By forming large numbers of memory cells in a chip, large economies in the cost per chip can result if reasonable yields are obtained. However, as the size of a chip increases, the yield decreases; so that the advantages of larger chip sizes are outweighed by reduction in yield. Accordingly, it is desirable to reduce the area occupied by each cell in a RAM.

Three types of cells are currently used in the construction of semiconductor random access memory chips. These memory cell types are called the one-transistor cell, the double level polysilicon cell (DLP cell), and the charge coupled cell (CC cell). Since the fabrication techniques herein disclosed relate primarily to CC cells and DLP cells the following discussion will concentrate on these two areas. The double level polysilicon cell is described in U.S. Pat. No. 3,720,922 by W. F. Kosonocky and in co-pending application, Ser. No. 648,594, filed Jan. 12, 1976, entitled "MOS Memory Cell Using Double Level Polysilicon" by Ching-Kiang Kuo. In a DLP cell two levels of polycrystalline silicon rather than one is used. The first level provides the upper plate of storage capacitors for the cells in a column. This level is connected to a bias voltage supply and is common to all cells in a column. The second level provides the gates of the MOS transistors, and also the connection from the gates to the overlying middle strip which is the X address line.

The CC cell is described in co-pending application, Ser. No. 739,758, filed Nov. 8, 1976, now issued as U.S. Pat. No. 4,060,738 on Nov. 29, 1977. The charge coupled RAM cell combines the storage capacitor and transfer gate of the one-transistor cell into a single gate. The resulting cell is simpler than the conventional one-transistor cell and possesses significant advantages in packing density and potentially higher yield. Two approaches have been used in making a charge coupled RAM cell, first having an implanted transfer region and second having an implanted storage region. In an N-channel CC RAM cell with an implanted storage region, the structure consists of a single gate which overlies two different gate regions. The storage region contains a shallow N-type ion implant very near the silicon oxide-silicon substrate interface and a relatively deep P-type ion implant, while the transfer region is free of implants. In the store mode, the word line gate is off, but an isolated potential well exists in the storage region due to the N-type implant which shifts the flat-band voltage to a negative value. When the word line gate is turned on, as for example in a read or write mode, the surface potential in a transfer region is more positive than that in the storage region due to the P-type implant which effectively increases the substrate doping in the storage region. The operation of this cell follows that of a one-transistor cell. The second approach that may be used to realize a CC RAM cell is a structure having an implanted transfer region where the cell has a single gate overlying a uniformly thick oxide. The storage region consists of the normal substrate material while the transfer region contains a relatively deep P-type implant to enhance the substrate doping. This implant causes the surface potential in the transfer region to vary sublinearly with gate voltage. The operation of this cell is such that when the word line is turned on to write information into the cell, a potential well is formed under the storage region whereas a barrier exists in the transfer region. If the bit line is held more positive than the surface potential in the transfer region, no charge flows and a '0' is written. If the bit line voltage is lowered below the surface potential in the transfer region, charge fills the well and a '1' is written. The word line voltage is then lowered to an intermediate level for the store mode to isolate the bit line from the storage region. To read the contents of the cell, the word line voltage is dropped to or near ground pushing the stored charge onto the bit line. The operation of this cell is a departure from that of the conventional one-transistor cell.

In the fabrication of integrated circuits there is a continuous thrust toward greater packing density. This, of course, lends itself to smaller and smaller lithographic dimensions. As the dimensions of the geometry that must be patterned decrease, the yield can be expected to decrease due to the increased difficulty in patterning the smaller geometry. With today's manufacturing equipment, alignment accuracy is greater than the minimum geometry that can be patterned, especially in optical lithography. That is, a typical align and expose tower is capable of alignment within 0.05 mils and a minimum resist definition within 0.15 or 0.20 mils in a manufacturing environment. Advantage may be taken of the alignment accuracy by employing offset alignment techniques to increase density while maintaining the same minimum patterned geometry constraint. Offset alignment fabrication techniques have been utilized in increasing the packing density in serial memory charge coupled devices as described in co-pending application, Ser. No. 691,656 filed on June 1, 1976, now issued as U.S. Pat. No. 4,027,381 on June 7, 1977, and in the publication by R. W. Bower, T. A. Zimmerman and A. M. Mohsen, entitled "A High Density Overlapping Gate Charge Coupled Device Array" presented at the IEDM, December, 1973. The present invention uses offset alignment techniques to optimize the packing density of random access memories without decreasing the minimum pattern resist geometry needed for a charge coupled cell of a double-level poly cell.

SUMMARY OF THE INVENTION

In accordance with the present invention, a method of fabricating CC RAM cells and DLP RAM cells using offset photolithographic alignment techniques is disclosed. The method steps common to all embodiments include oxidizing a silicon substrate and depositing a layer of silicon nitride thereon, forming moats in the layers of the silicon nitride, the oxidized layer and in the silicon substrate using a photoresist overlay and lithographic techniques to pattern the resist, followed by etching for defining channel stop regions patterned to have a minimum geometry $\Delta$. Thereafter P-type ions are introduced throughout the channel stop area. An insulating material in the form of thick silicon oxide, for example, is then disposed on the channel stop areas while the layer of silicon nitride and the oxidized layer on the substrate are removed thereafter. The silicon substrate between the channel stop areas is then re-oxidized forming storage and transfer gate regions.

In one embodiment of the present invention where a double level poly-cell is fabricated, the method further includes applying a layer of conductive material (such as polysilicon) partially over the insulating material in the channel stop area, that is using a photomask designed such that it is placed partially over the channel stop and partially over the layer of gate oxide material disposed on the silicon substrate. The total length of the conductive material is the length of the minimum geometry pattern desired. The re-oxidized gate area between the defined cells is then removed and the oxide regrown simultaneously oxidizing the conductive material (polysilicon) and the silicon substrate thus providing for an insulation cover for the conductive material. A second layer of conductive material is then disposed over the oxidized first layer of conductive material in an offset fashion having a length of the minimum geometry desired thus overlapping partially the gate region leaving a gate area equal in length to a predetermined fraction of the minimum geometry $\Delta$. After stripping the remaining gate area, an impurity material is introduced into the face of the silicon substrate to create a doped (N+) sense line. Finally, a third layer of conductive material is patterned over all oxidized material to define a conductor. The metal conductor is patterned to form connecting leads on the total chip area.

A second embodiment of the present invention involving fabrication of a CC RAM having an implanted transfer region follows the above-described common method steps by first depositing a photoresist material over the thick oxide region which is disposed on the channel stop areas in a manner such that the photoresist is of a length equal to the minimum geometry and partially covering the thick oxide region and partially covering the gate oxide. P-type ions are then introduced into the surface region of the silicon substrate. The photoresist material is then selectively removed and a conductive material is patterned in a similar offset fashion over the thick oxide region and the oxidized layer again having a length equal to the minimum geometry, however leaving a predetermined length of the gate region less than the minimum geometry uncovered. The oxidized layer disposed on the silicon substrate in the area between the conductive material and the insulating layer over the succeeding channel region is then removed and an N-type layer is diffused or ion implanted therein forming a sense line having a length less than the minimum pattern geometry $\Delta$. A chemical vapor deposition reflow oxide is then disposed over the thick oxide region covering the cell region, the diffused area and partially over said conductive material leaving a length of conductive material equal to the minimum geometry for purposes of connecting to the overlying metal conductor. A second layer of conductive material is then disposed over the entire chemical vapor deposition reflow oxide and over that portion of the first conductive layer left exposed.

Other embodiments using offset alignment techniques to fabricate a random access memory cell include fabricating a CC cell having an implanted storage region where a shallow N-type implant and a deeper P-type implant is used in the storage region. The definition of a sense line having a geometry pattern less than the minimum geometry is fabricated using the same masking techniques of depositing the various materials in an offset fashion as described in prior embodiments.

DETAILED DESCRIPTION OF THE DRAWINGS

Referring now to the Figures, a method of making a charge coupled RAM cell having an implanted transfer region will now be described with particular reference to FIGS. 1a–1c. This method includes steps which are common to the fabrication of the charge coupled RAM cell having implanted transfer or implanted storage regions and also for the fabrication of a double level poly cell. These common steps will be pointed out so that they may be referred to in a later description of the fabrication method for the CC RAM with implanted storage region and the DLP cell structures.

Figure 1A:
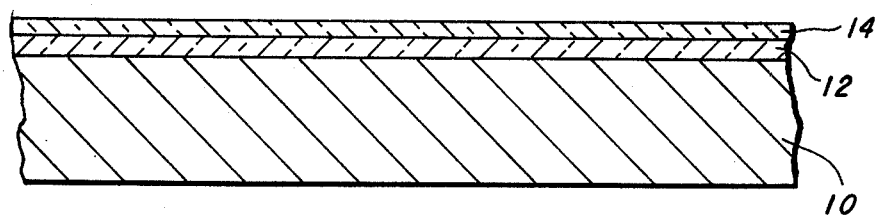
FIGS. 1a–1f are sectional views of a charge-coupled RAM cell having an implanted transfer region, at various stages in the manufacture thereof in accordance with the present invention.

The starting material used in the fabrication process is a substrate of monocrystalline, semiconductor grade silicon; of which only a very small bar 10 is illustrated in FIG. 1a having the bar greatly distorted in dimensions. The RAM cell structure fabrication method described herein will be for a N-channel structure although it will be understood that the same method may be used to formulate a P-channel structure in all embodiments herein described. The small area of the bar 10 which is seen in FIGS. 1a–1e contains one complete cell having a width of less than 1 mil. Table A illustrates the cell size in mils$^2$ and the total chip area for a 64K-bit, 256K-bit and 1 megabit chip for those minimum geometries obtainable using lithographic techniques according to fabrication methods of the present invention and designated $\Delta$ in Table A. Table A further reflects in the total chip area size that 50% of the area is occupied by peripheral circuitry such as sense amplifiers, decode circuitry, input/output buffers, bonding pads and the like. In the actual scale, the various layers in regions in the figures would be very thin compared to the width dimensions.

TABLE A

| A (microns) | cell-size microns$^2$ | mils$^2$ | 64K area tct. chip | $10^3$ mil$^2$ 256K | 1M |
|---|---|---|---|---|---|
| 5 | 125 | 0.2 | 26 | 105 | — |
| 3 | 45 | 0.07 | 10 | 40 | 160 |
| 2 | 20 | 0.03 | 5 | 20 | 80 |

The silicon slice is first oxidized by steam oxidation at 950°–1000° C., for example, for a period of time allowing for the growth of the oxide layer 12 to be between 100–1,000 Å thick. A layer 14 of silicon nitride Si$_3$N$_4$ is then applied over the oxide by exposing the slice to an atmosphere of silane and ammonia in an rf plasma discharge or by other high temperature (600°–1000° C.) CVD methods. The plasma is deposited at approximately 300° C.

Figure 1B:
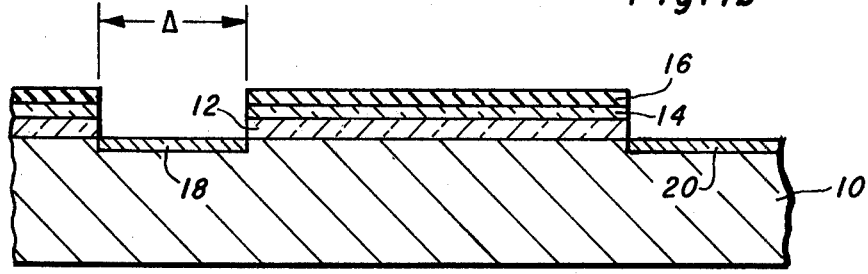

As shown in FIG. 1b an optical photoresist 16 is then deposited over the silicon nitride layer 14; typically the photoresist is KMER (Kodak metal etch resist) or Kodak Microneg 747 available from Eastman Kodak, Rochester, N.Y. The photoresist is then exposed using optical lithography with a pre-designed photomask not shown. For optimum results using e-beam or x-ray lithography a different resist material would be used such as PMMA for example. Thereafter, the photoresist is developed and when using a negative resist after exposure to light it hardens and protects the underlying layers, while the opaque areas of the resist not exposed when developed will wash away leaving the underlying areas exposed. The photomask is designed to define the desired pattern of the moats and apertures exposed and thereafter etched through the silicon oxide and silicon nitride layers 12 and 14 by a buffered hydrogen fluoride solution or plasma etch. The channel stop regions 18 and 20 are then formed by implanting the moats with boron using a beam of 40–80 KEV with a dosage equaling $5 \times 10^{12\ cm-2} - 2 \times 10^{13\ cm-2}$.

Figure 1C:
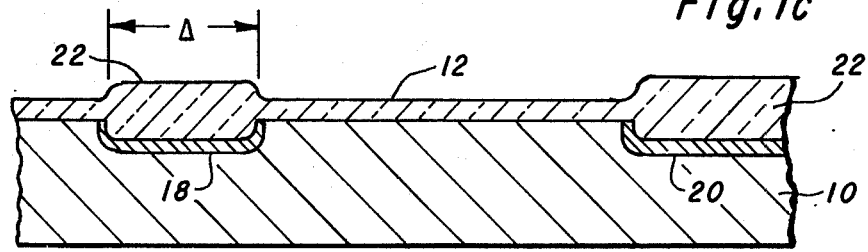

Referring now more particularly to FIG. 1c, the channel stop regions 18 and 20 are field oxidized forming a thick oxide region 22 at approximately 900°–1000° C. to a thickness of between 5,000 and 11,000 Å thick. After field oxidation, the silicon nitride layer 14 is removed using a plasma etch or wet etch as for instance hot phosphoric acid. The original layer 12 of oxidized silicon material is also removed and thereafter regrown to approximately the same oxide thickness to form the thin gate oxide 12.

The method steps described thus far are those common method steps applicable to the fabrication method for the CC RAM with both implanted transfer and implanted storage regions and the fabrication method for making the double level poly RAM cell all using the offset alignment technique.

Figure 1D:
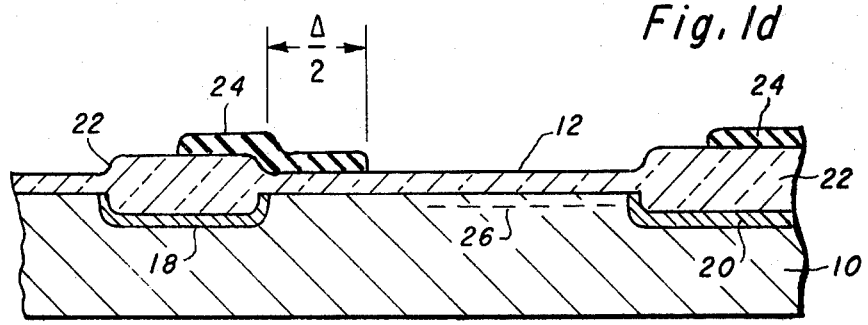
Figure 1E:
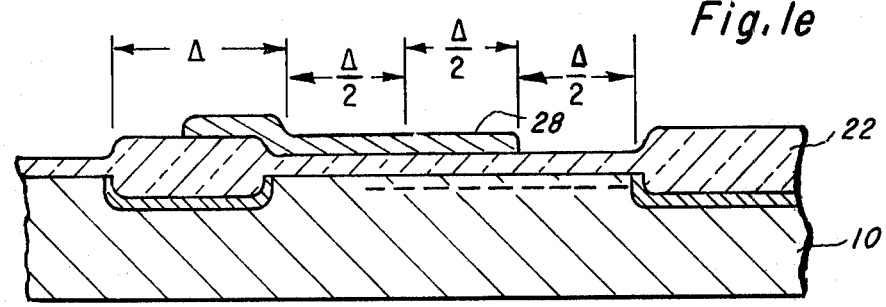
Figure 1F:
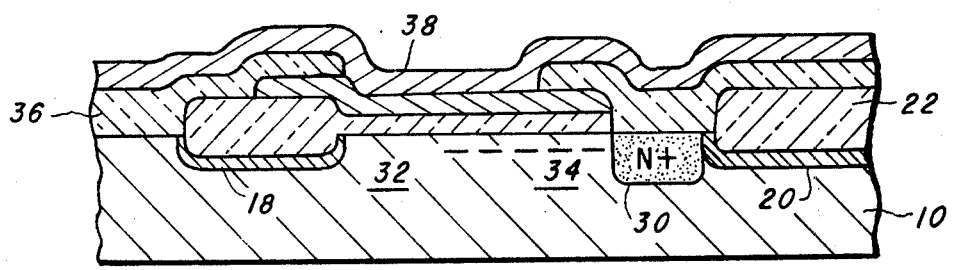

Referring now to FIGS. 1d–1f and more particularly to those specific method steps applicable to the fabrication of a charge coupled RAM cell having an implanted transfer region; a layer of photoresist material 24 is deposited over oxide layers 22 and 12. The photoresist layer 24 is then patterned using lithographic techniques to expose the photoresist material to allow for defining desired patterns by etching.

A photomask is designed and used to expose areas on the structure by photographic techniques. The photomask is designed with the constraint of a minimum pattern geometry Δ available with present lithographic techniques. Each subsequent photomask is aligned with respect to the prior mask and offset to define gate and sense line regions having smaller geometric dimensions than standardly available. FIGS. 1d and 1e illustrate the result of depositing and patterning material by using photomasks aligned in an offset manner from one another. The regions thus defined have lengths equal to a predetermined fraction of the minimum pattern geometry.

The area of the oxide 12 not protected by photoresist is then implanted with boron ions via a beam of approximately 30–70 KEV and a dosage of $1-5 \times 10^{12\ cm-2}$. The implanted area has a total length equal to the minimum geometry obtainable using lithographic techniques.

In fabricating a charge coupled RAM cell having an implanted transfer region, a first layer of conductive material 28 is deposited which may be in the form of doped polysilicon material where the doping ion is an N-type ion as, for example, phosphorus. The first layer of conductive material 28 is patterned using photomasks offset aligned to the thick oxide layer 22 and the thin gate oxide layer 12. The remaining area of the thin gate oxide layer 12 between the first conductive layer 28 and the channel stop region 20 is then removed and the substrate 10 in that region is diffused or implanted using an N-type dopant as phosphorus, for example, thus forming a sense line area having a width less than the minimum pattern geometry Δ, as Δ/2 for example. Thus the storage gate 32, the transfer gate 34, and the sense line 30 each have a length less than that of the minimum pattern geometry.

Reflow oxide 36 as for example phosphorus oxide is then deposited over thick oxide region 22, polysilicon layer 28, and the sense line region 30. The reflow oxide 36 is then patterned as described in the method steps above exposing a region on the conductive layer 28 through an opening in the reflow oxide 36 allowing a second layer of conductive material 38 to be deposited over reflow oxide 36 and the exposed region on the first conductive layer of polysilicon 28 to form a contact between the conductive layers 28 and 38.

Those method steps used in fabricating the sense line and conductor are also common to the fabrication method for a CC cell having an implanted storage or transfer region and a double level poly cell.

Further illustrated in FIG. 1c is the length, Δ, where Δ is the minimum pattern geometry using lithographic techniques. The storage and transfer gate regions 32 and 34 are designed using the present invention to be less than the minimum geometry, as Δ/2, for example. Using Δ/2, the total cell length including the sense line is 2.5Δ. Where the cell width is 2Δ, 1Δ for a channel stop and 1Δ for a storage capacitor and transfer gate the cell size is 5Δ$^2$. This 5Δ$^2$ size is less than the recognized industry standard of 8Δ$^2$.

Figure 2A:
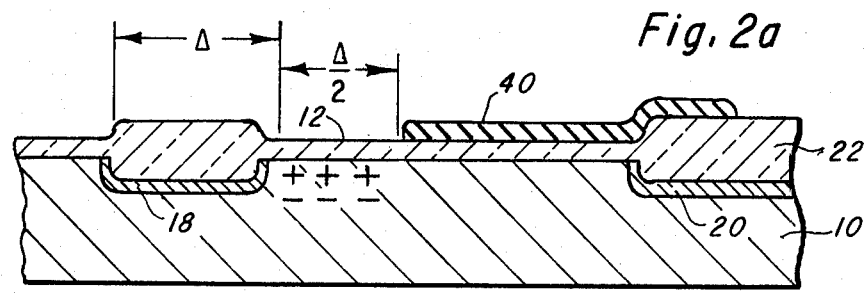
FIGS. 2a–2c are sectional views of a charge-coupled RAM cell having an implanted storage region, at various stages in the manufacture thereof in accordance with the present invention.
Figure 2B:
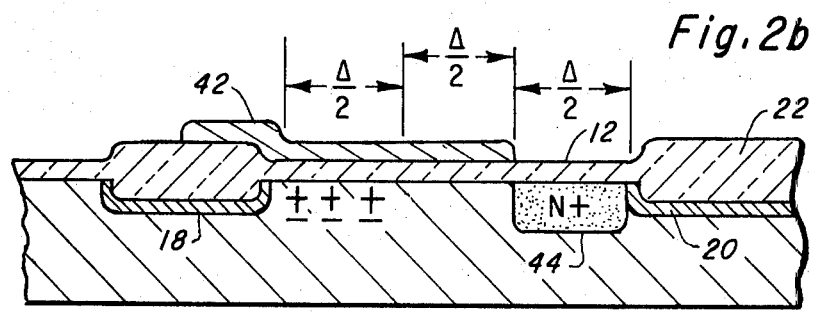
Figure 2C:
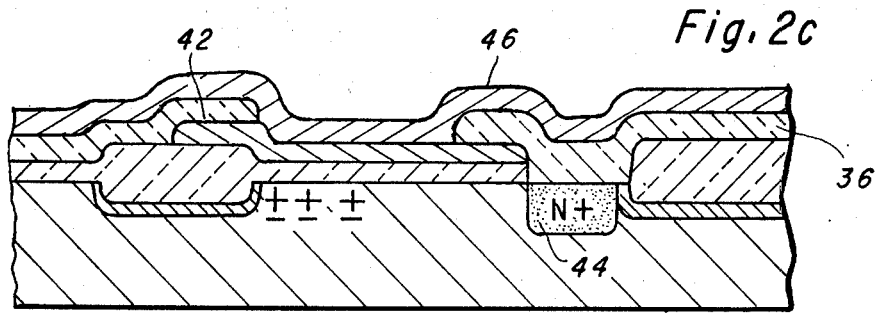

FIGS. 2a–2c of the drawings show sectional views of the fabrication steps for a charge coupled RAM cell having an implanted storage region. In fabricating a charge coupled RAM cell having an implanted storage region, the same common steps described with relation to FIGS. 1a–1c are applicable. Continuing the method, and more specifically referring to FIG. 2a, a layer of photoresist material 40 is patterned using the same patterning technique described above, with a photomask designed such that the photoresist layer 40 retained is disposed in an offset manner over the thick oxide region 22 disposed over the channel stop region 20 and partially extending over the gate oxide layer 12 leaving that portion of the thin gate oxide layer 12 exposed equaling in length to a predetermined distance less than the minimum pattern geometry using presently available lithographic techniques. The exposed area of thin gate oxide layer 12 is then implanted with a P-type implant into the surface of the silicon substrate 10 and thereafter a shallow N-type ion is introduced in the same region. After stripping the photoresist material 40 a layer of polysilicon material 42 is disposed over oxides 22 and 12 and patterned as described above such that the remaining strip of polysilicon 42 is disposed in an offset fashion over the channel stop region 18 and partially extending over the thin gate oxide layer 12 such that the remaining portion of the thin gate oxide layer 12 is less than the minimum pattern geometry using the presently available lithographic techniques and such that the unimplanted oxide region covered by layer 42 is less than the minimum geometry. The fabrication steps for forming the sense line 44 and the conductor 46, as polysilicon for example, disposed over the reflow oxide 36 and the polysilicon strip 42 are identical to the method steps for fabricating the same with respect to the fabrication of the charge coupled RAM cell having an implanted transfer region as described above.

Figure 3A:
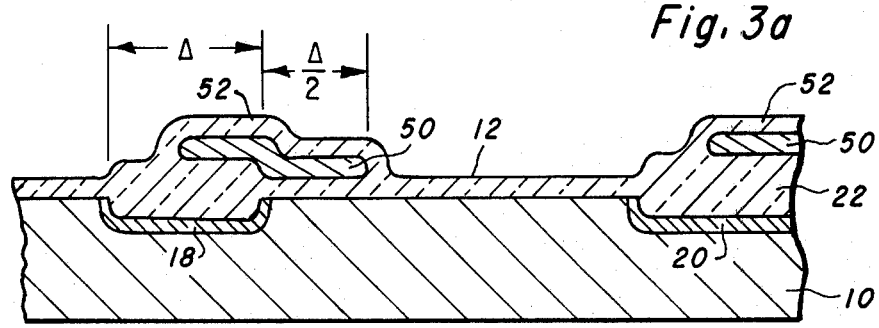
FIGS. 3a–3c are sectional views of the double level poly cell at various stages in the manufacture thereof in accordance with the present invention.
Figure 3B:
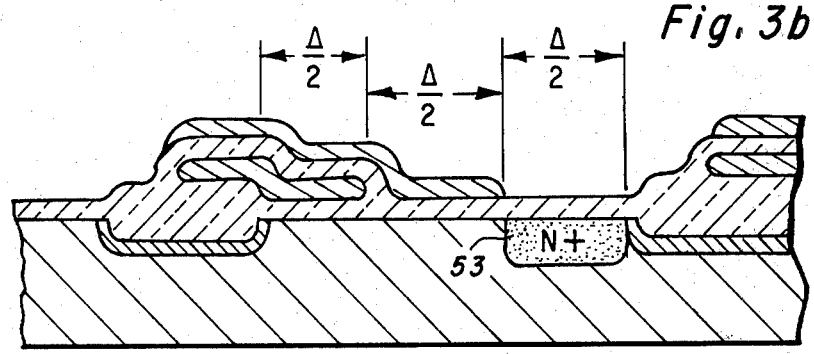
Figure 3C:
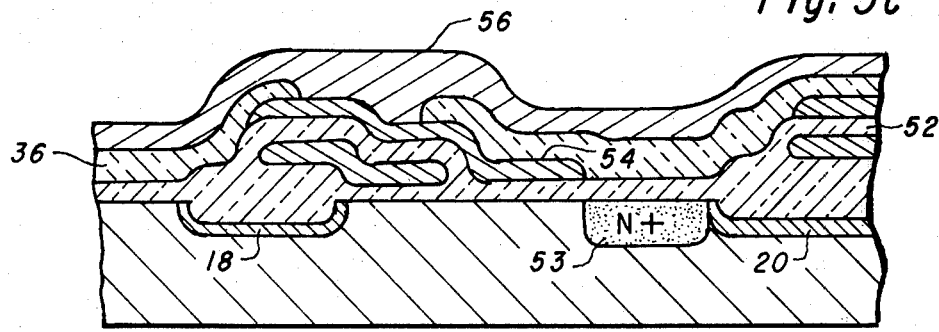

FIGS. 3a–3c of the drawings show sectional views of the fabrication steps for a double level poly cell. Again, the method continues from the common method steps illustrated for the CC RAM cell having an implanted transfer region, presented in the description of FIGS. 1a–1c where the structure has been fabricated to the point of having a silicon substrate 10 with channel stop regions designated therein 18 and 20 and having thick oxide regions 22 disposed thereon with an intermediate thin gate oxide layer 12 disposed between the thick oxide regions 22. A first conductive layer 50 as polysilicon, for example, is then deposited over the oxides 22 and 12 as shown in FIG. 3a and patterned as described above leaving a strip of polysilicon 50 disposed in an offset manner over the channel stop region 18 and partially extending over the thin gate oxide 12. The polysilicon layer is doped by either N-type diffusion as for example phosphorus or by an ion implant of an N-type before patterning. Thereafter, the thin gate oxide 12 is stripped and regrown simultaneously with an insulation oxide 52 covering the layer 50 of polysilicon material. The second gate oxidation may be of a different thickness than the first gate oxide thickness. Thus the conductive material 50 has an insulation layer 52 thereon. In FIG. 3b, a second conductive layer is disposed on the regrown oxide 12 and the insulation layer 52 disposed on the first conductive layer 50. This second conductive layer may be of a polysilicon material or refractive metal such as molybdenum or tungsten and patterned as described above using a photomask leaving a conductive material 54 patterned such that it partially covers the insulation material 52 in the channel stop region 18 and is further disposed over the thin gate oxide region 12 such that the thin oxide layer 12 is exposed only in a length equal to less than the minimum pattern geometry. The fabrication methods for defining the sense line area 53 and growing a reflow oxide 36, patterning it and defining a conductor 56 disposed over the reflow oxide 36 as illustrated in FIG. 3c are the same as described above for the CC RAM cell having both implanted storage and transfer regions.

Although the invention has been described with reference to specific embodiments, this description is not meant to be construed in a limiting sense. Various modifications of the disclosed embodiments, as well as other embodiments of the invention, will become apparent to persons skilled in the art upon reference to the description of the invention. An example of a further embodiment is a fabrication method for a high capacity RAM cell using offset alignment techniques described with respect to the embodiments illustrated and further using the fabrication methods described in co-pending application, Ser. No. 752,598, filed Dec. 20, 1976, now U.S. Pat. No. 4,112,575 issued Sept. 12, 1978.

What is claimed is:

1. In a method of fabricating an array of memory cells for a random access memory, comprising the steps of:
   providing an oxide layer on a substrate of semiconductor material of a first conductivity type,
   depositing a layer of silicon nitride on said oxide layer,
   selectively exposing portions of said silicon nitride layer and the underlying portions of said oxide layer and said substrate in registration therewith to an etchant,
   forming moats in said substrate extending below the surface thereof,
   introducing a dopant impurity of a first conductivity type below the surfaces of said moats in said substrate to define channel stop regions,
   filling said moats and the etched-through portions of said oxide layer and said silicon nitride layer with oxide to define thick field oxide regions extending from said moats above the surface of said substrate,
   removing said silicon nitride layer and said oxide layer,
   providing a relatively thin gate oxide layer on said substrate extending between said thick field oxide regions,
   depositing at least one layer of conductive material forming one electrode in offset alignment to said thick field oxide regions and said thin gate oxide layer defining gate and sense line regions under said conductive material within said substrate having a length a predetermined fraction of said minimum pattern geometry $\Delta$,
   removing the exposed part of the thin gate oxide layer,
   redepositing the thin gate oxide layer on said substrate to include an oxide layer covering said conductive material,
   introducing a dopant impurity of a second conductivity type into the substrate beneath the exposed portions of the redeposited thin gate oxide layer to define regions of opposite conductivity to said substrate serving as a sense line having a length a predetermined fraction of said minimum pattern geometry $\Delta$,
   depositing a reflow oxide over the resulting structure and patterning said reflow oxide so as to expose a portion of said electrode,
   depositing a second layer of conductive material over the resulting structure, and
   patterning said second conductive layer to define word lines.

2. Method of fabricating an array of memory cells for a random access memory, comprising the steps of:
   providing an oxide layer on the substrate of a semiconductor material of a first conductivity type,
   depositing a layer of silicon nitride on said oxide layer,
   selectively exposing portions of said silicon nitride layer and the underlying portions of said oxide layer and said substrate in registration therewith to an etchant, forming moats in said substrate extending below the surface thereof by etching through the selectively exposed portions of said silicon nitride layer and the underlying portions of said oxide layer in registration therewith and partially into the substrate, wherein each of said moats has a minimum pattern geometry $\Delta$, introducing a dopant impurity of said first conductivity type below the surfaces of said moats and said substrate to define channel stop regions, filling said moats and the etched through portions of said oxide layer and the silicon nitride layer with oxide to define thick field oxide regions extending from said moats above the surface of said substrate, removing said silicon nitride layer and said oxide layer, providing a relatively thin gate oxide layer on said substrate extending between said thick field oxide regions, depositing a first layer of conductive material on said thick field oxide regions and said thin gate oxide layer, patterning said first layer of conductive material to define respective offset electrodes disposed as first level electrodes each of which includes a first electrode portion partially extending over one of said thick field oxide regions and a second electrode portion offset with respect to said first electrode portion and extending over a portion of said thin gate oxide layer adjacent to said thick field oxide region, where the substrate area under said second electrode portion defines a gate region having a length equal to a fraction of said minimum pattern geometry $\Delta$, removing the exposed part of the thin gate oxide layer, redepositing the thin gate oxide layer on said substrate to include an oxide layer covering said offset electrodes, depositing a second layer of conductive material over the redeposited thin gate oxide layer and said oxide layer covering said offset electrodes, patterning said second layer of conductive material to define a second level electrode insulated from said first level electrode including a first end electrode portion overlying said thick oxide region and said oxide layer covering said offset electrode and a second end electrode portion overlying a portion of the redeposited thin gate oxide layer so as to define the area under said second end electrode portion as a gate region having a length equal to a fraction of said minimum pattern geometry $\Delta$, introducing a dopant impurity of a second conductivity type into the substrate beneath the remaining exposed portion of the redeposited thin gate oxide layer to define a region of opposite conductivity to said substrate serving as a sense line and having a length equal to a fraction of said minimum pattern geometry $\Delta$, depositing a reflow oxide over the resulting structure and patterning said reflow oxide so as to expose an area on said second level electrode, depositing a third layer of conductive material over the resulting structure, and patterning said third conductive layer to define word lines.

3. A method of fabricating an array of memory cells for a random access memory as set forth in claim 2, wherein said substrate comprises a silicon material.

4. A method of fabricating an array of memory cells for a random access memory as set forth in claim 2, wherein said first conductivity comprises P-type ions.

5. A method of fabricating an array of memory cells for a random access memory as set forth in claim 2, wherein said first layer of conductive material is polysilicon.

6. A method of fabricating an array of memory cells for a random access memory as set forth in claim 5, wherein said first conductive layer of said polysilicon is doped with an N-type ion.

7. A method of fabricating an array of memory cells for a random access memory as set forth in claim 2, wherein said second layer of conductive material is polysilicon.

8. A method of fabricating an array of memory cells for a random access memory as set forth in claim 2, wherein said dopant impurity of a second conductivity type comprises an N-type ion.

9. A method of fabricating an array of memory cells for a random access memory as set forth in claim 2, wherein said reflow oxide is a phosphorus doped oxide.

10. A method of fabricating an array of memory cells for a random access memory, comprising the steps of:

providing an oxide layer on a substrate of semiconductor material of a first conductivity type, depositing a layer of silicon nitride on said oxide layer, selectively exposing portions of said silicon nitride layer and the underlying portions of said oxide layer and said substrate in registration therewith to an etchant forming moats in said substrate extending below the surface thereof by etching said selectively exposed portions of said silicon nitride and the underlying portions of said oxide layer in registration therewith and partially into said substrate, wherein each of said moats has a minimum pattern geometry $\Delta$, introducing a dopant impurity of said first conductivity type below the surface of said moats in said substrate to define channel stop regions, filling said moats and the etched through portions of said oxide layer and said silicon nitride layer with oxide to define thick field oxide regions extending from said moats above the surface of said substrate, removing said silicon nitride layer and said oxide layer, providing a relatively thin gate oxide layer on said substrate extending between said thick field oxide regions, depositing a layer of photoresist material over said thick field oxide regions and said thin gate oxide layer, patterning said photoresist material in offset alignment to one of said thick field oxide regions and having a first portion of said photoresist material disposed on said thick field oxide region and a second portion of said photoresist material disposed on said thin gate oxide layer so as to define a gate region under said second portion having a length equal to a predetermined fraction of said minimum pattern geometry $\Delta$, introducing ions of a second conductivity type below the surface of said substrate under the remaining exposed thin gate oxide layer, removing said photoresist material, depositing a first layer of conductive material on said thick field oxide regions and said thin gate oxide layer, patterning said first layer of conductive material in offset alignment to said other thick field oxide region defining an offset electrode having a first end portion disposed partially over said thick field oxide region and a second end portion of said conductive material disposed over said thin gate oxide layer such that the remaining unexposed thin gate oxide layer has a length equal to a predetermined fraction of said minimum pattern geometry $\Delta$, removing the exposed part of the thin gate oxide layer, redepositing the thin gate oxide layer on said substrate to include an oxide layer covering said offset electrode, introducing a dopant impurity of a second conductivity type into the substrate beneath the exposed portions of the redeposited thin gate oxide layer to define regions of opposite conductivity to said substrate serving as a sense line having a length equal to a fraction of said minimum patterned geometry $\Delta$, depositing a reflow oxide over the entire structure and patterning said reflow oxide to expose a region on said offset electrode, depositing a second layer of conductive material over the resulting structure, and patterning said second layer of conductive material to define word lines.

11. A method of fabricating an array of memory cells for a random access memory as set forth in claim 10 wherein said first conductivity type comprises P-type ions.

12. A method of fabricating an array of memory cells for a random access memory as set forth in claim 10 wherein said ions of a second conductivity type are N-type ions.

13. A method of fabricating an array of memory cells for a random access memory as set forth in claim 10 wherein said first layer of conductive material is polysilicon.

14. A method of fabricating an array of memory cells for a random access memory as set forth in claim 10 wherein said second layer of conductive material is polysilicon.

15. A method of fabricating an array of memory cells for a random access memory as set forth in claim 10, wherein said reflow oxide is a phosphorus doped oxide.

16. A method of fabricating an array of memory cells for a random access memory, comprising the steps of:

providing an oxide layer on a substrate of semiconductor material of a first conductivity type, depositing a layer of silicon nitride on said oxide layer, selectively exposing portions of said silicon nitride layer and the underlying portions of said oxide layer and said substrate in registration therewith to an etchant, forming moats in said substrate extending below the surface thereof by etching through the selectively exposed portions of said silicon nitride layer and the underlying portions of said oxide layer in registration therewith and partially into said substrate, wherein each of said moats has a minimum pattern geometry $\Delta$, introducing a dopant impurity of said first conductivity type below the surfaces of said moats in said substrate to define channel stop regions, filling said moats and the etched-through portions of said oxide layer and said silicon nitride layer with oxide to define thick field oxide regions extending from said moats above the surface of said substrate, removing said silicon nitride layer and said oxide layer, providing a relatively thin gate oxide layer on said substrate extending between the thick field oxide regions, depositing a layer of photoresist material and patterning said photoresist material such that a first portion is offset aligned on one of said thick field oxide regions and partially disposed on said thin gate oxide layer thus leaving an exposed thin gate oxide layer having a length equal to a predetermined fraction of said minimum pattern geometry $\Delta$, introducing dopant impurities below the substrate surface beneath the area defined by the exposed thin gate oxide layer, removing said layer of photoresist material, depositing a first layer of conductive material over the resulting structure, patterning said first layer of conductive material to form an offset electrode having a first end portion disposed in offset alignment to said other thick oxide region and extending on said thin gate oxide layer leaving an area of exposed gate oxide layer equal in length to a predetermined fraction of said minimum pattern geometry $\Delta$, removing the exposed part of the thin gate oxide layer, redepositing the thin gate oxide layer on said substrate to include an oxide layer covering said offset electrode, introducing a dopant impurity of a second conductivity type into the substrate beneath the exposed portions of the redeposited thin gate oxide layer to define regions of opposite conductivity to said substrate serving as a sense line having a length equal to a predetermined fraction of said minimum pattern geometry $\Delta$, depositing a reflow oxide over the resulting structure and patterning said reflow oxide so as to expose a portion of said offset electrode, depositing a second layer of conductive material over the resulting structure, and patterning said second layer of conductive material to define word lines.

17. A method of fabricating an array of memory cells for a random access memory as set forth in claim 16, wherein said dopant impurities introduced below the substrate surface beneath the area defined by the exposed thin gate oxide layer comprise a deep dopant impurity and a shallow dopant impurity introduced into said substrate.

18. A method of fabricating an array of memory cells for a random access memory as set forth in claim 17 wherein said deep dopant impurity is a P-type ion and said shallow dopant impurity is an N-type ion.

19. A method of fabricating an array of memory cells for a random access memory as set forth in claim 16, wherein said first conductivity type comprises P-type ions.

20. A method of fabricating an array of memory cells for a random access memory as set forth in claim 16, wherein said dopant impurity of said second conductivity type comprises N-type ions.

21. A method of fabricating an array of memory cells for a random access memory as set forth in claim 16, wherein said first layer of conductive material is polysilicon.

22. A method of fabricating an array of memory cells for a random access memory as set forth in claim 16, wherein said second layer of conductive material is polysilicon.

23. A method of fabricating an array of memory cells for a random access memory as set forth in claim 16, wherein said reflow oxide is a phosphorus doped oxide.

* * * * *